United States Patent [19]

Novacek

[11] Patent Number: 4,763,227
[45] Date of Patent: Aug. 9, 1988

[54] ALUMINUM ELECTROLYTIC CAPACITOR PACKAGE WITH STABILIZING THIRD LEAD

[75] Inventor: William G. Novacek, Hillsville, Va.

[73] Assignee: Sprague Electric Company, North Adams, Mass.

[21] Appl. No.: 80,937

[22] Filed: Aug. 3, 1987

[51] Int. Cl.⁴ .......................... H01G 9/00; H05K 1/18
[52] U.S. Cl. ...................................... 361/433; 338/317
[58] Field of Search ................. 361/433, 5 ACT, 404, 361/405, 306, 307; 29/570.1, 569; 338/317, 329; 174/194, 52 R

[56] References Cited

U.S. PATENT DOCUMENTS

| | | | |
|---|---|---|---|
| 2,754,486 | 7/1956 | Hathorn | 361/405 X |
| 3,058,037 | 10/1962 | Naab et al. | 361/405 X |
| 3,162,721 | 12/1964 | Rayburn | 174/68.5 |
| 3,335,335 | 8/1967 | Perkins | 361/433 |
| 3,396,315 | 8/1968 | Stokes | 361/433 |
| 3,458,645 | 7/1969 | Braiman | 338/317 X |
| 3,693,052 | 9/1972 | Galanti | 361/405 |
| 3,747,045 | 7/1973 | Stross | 339/17 C |
| 4,363,078 | 12/1982 | Dwyer | 361/433 |
| 4,370,804 | 2/1983 | Misawa et al. | 29/741 |
| 4,589,058 | 5/1986 | Peternell et al. | 29/570.1 X |

OTHER PUBLICATIONS

Engineering Bulletin No. 3453, copyright 1983, Sprague Electric Company, Lexington, Mass.

*Primary Examiner*—Donald A. Griffin

[57] ABSTRACT

A low cost aluminum electrolytic capacitor package having axial anode and cathode leads extending in one direction is capable of being seated and wave-solder connected in horizontal position to a printed circuit board without rolling, which unwanted rolling may result in withdrawal of one lead that consequently may not receive solder. A dummy lead is bonded to the opposite end of the package to stabilize the capacitor after solder mounting. One of the three leads has an ox-bow bend that tends to stop the unwanted rolling.

6 Claims, 1 Drawing Sheet

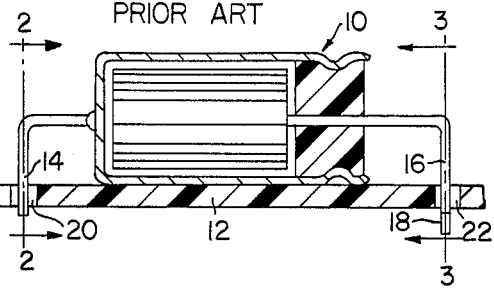
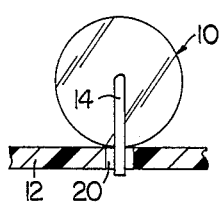
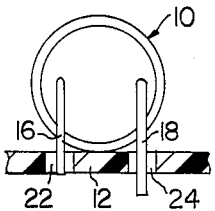
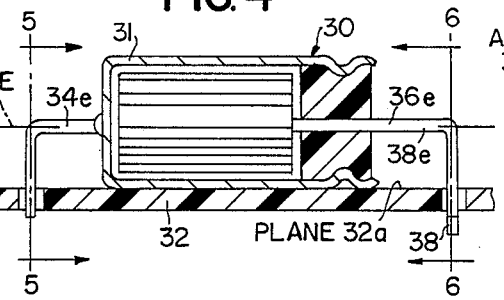
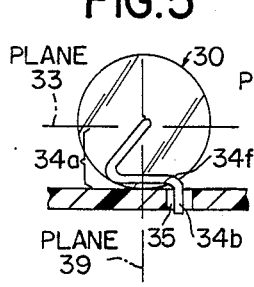
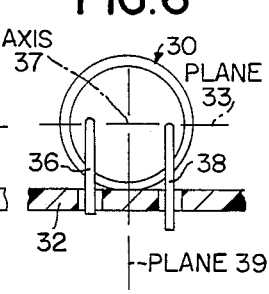
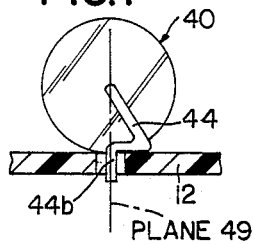
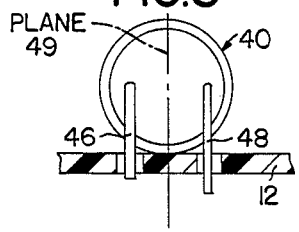
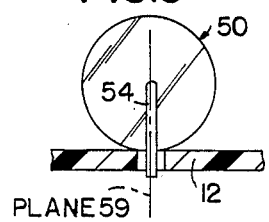
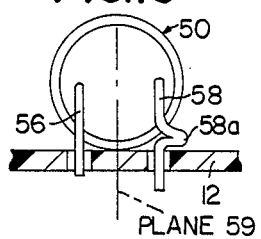
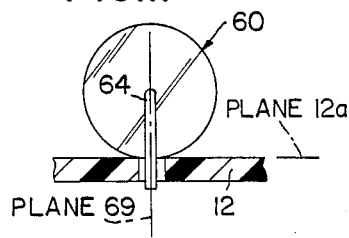
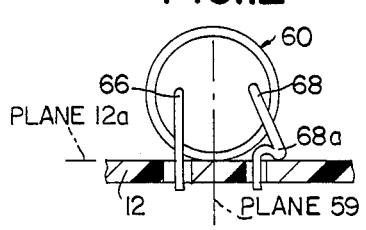

ALUMINUM ELECTROLYTIC CAPACITOR PACKAGE WITH STABILIZING THIRD LEAD

BACKGROUND OF THE INVENTION

This invention relates to a tubular aluminum electrolytic capacitor having a metal can housing and anode and cathode leads extending in one axial direction from the housing and a third dummy lead extending in the other axial direction from the housing.

Aluminum electrolytic capacitors of the wound foil type are typically housed in a cylindrical aluminum can. For low profile mounting to a printed circuit board, the can is laid on its side, and many such capacitor packages have an anode lead extending through a lead-to-can seal at one can end and the cathode lead extending in the opposite direction through a lead-to-can seal at the other can end. Such capacitor packages have their two leads bent at right angles and threaded through holes provided therefor in a printed circuit board. This assembly is then wave soldered.

However, it is substantially less expensive in manufacturing to make both anode and cathode leads extend in the same direction through one seal at one can end. To prevent the other can end from vibrating or from moving when inadvertently being pushed, a third wire lead is welded to the closed end. That lead is also bent and mechanically soldered at a printed circuit board hole provided therefor. This construction also has the advantage that the more closely parallel anode and cathode leads and printed circuit board wiring provides a substantial improvement in capacitor high frequency response. The package is described more fully in the Engineering Bulletin No. 3453, copyright 1983, Sprague Electric Company, Lexington, Mass.

Both of these capacitor packages conventionally have an anode lead that is longer (e.g. by 0.25 inch) than the cathode lead. This makes it possible to visually distinguish, and to distinguish by automatic means, e.g. by mechanical feelers, the anode from the cathode lead wires. These leads may be cut to equal lengths just prior to printed wire board assembly. Such single ended capacitors are being produced by highly automatic means at a very low cost all over the world. They are also being inserted into printed circuit boards and then automatically wave soldered.

Capacitors 10 of this kind may be connected electrically and mechanically to a printed wiring board 12 as indicated in FIGS. 1, 2 and 3. In these figures, the capacitor 10 is kept in position in the printed wiring board 12 by the three leads 14, 16 and 18 having been threaded through holes 20, 22 and 24, respectively, in the board ready for wave soldering to copper lands (not shown) that are bonded to the underneath side of the board.

This invention addresses a problem that is experienced after positioning on the printed wiring board and before the wave soldering step. There is a tendency for the cylindrical body to roll when the carrier that brings the printed circuit board to the wave solder machine either lists, hesitates, or experiences sudden lateral movement for any reason. At least one of the anode or cathode leads tend to withdraw from the printed wiring board hole enough so that the solder does not reach it and neither electrical nor mechanical connection is effected at wave soldering.

It is an object of this invention to provide an improved low cost aluminum electrolytic package that, when seated on a printed wiring board ready for soldering, is less likely to roll so that the anode or cathode lead is withdrawn far enough from its respective printed-wiring-board hole that it is not connected at soldering.

SUMMARY OF THE INVENTION

An aluminum electrolytic capacitor package includes a metal can encompassing a capacitor section, the anode and cathode leads from the section extending outwardly from the open end of the can in a direction parallel to the can axis. A third lead not electrically connected to the capacitor section, is bonded to the closed can end and extends axially in the opposite direction. The three leads are bent so that distal straight portions are directed at right angles away in one direction from the plane formed by the extending portions of the three leads. These three straight distal portions extend at right angles through an imaginary capacitor-mounting plane tangent to the cylindrical can. The bent away lead portions of only one of these leads has an ox-bow bend that extends orthogonally away from the can-axis-containing plane that is at right angles to the leads-forming plane. Thus, the ox-bow bend in one of the leads tends to prevent rolling of the cylindrical can when seated on a printed wiring board that is being moved into a wave-solder station.

BRIEF DESCRIPTION OF THE DRAWING

FIG. 1 shows in side sectional view an aluminum electrolytic capacitor package 10 sitting on a printed wiring board 12 ready for wave soldering as in the prior art.

FIG. 2 shows in rear end view the capacitor package 10 of FIG. 1 taken in plane 2—2 wherein the stabilizing third lead 14 is depicted as employed in the prior art.

FIG. 3 shows in front end view the capacitor package 10 of FIG. 1 taken in plane 3—3 wherein the cathode lead 16 and anode lead 18 are depicted as employed in the prior art.

FIG. 4 shows in side sectional view an aluminum electrolytic capacitor package 30 of this invention sitting on the printed wiring board 32 ready for wave soldering.

FIGS. 5 and 6 show, respectively, in rear end view taken in plane 5—5 and the front end view taken in plane 6—6 the capacitor package 30 on printed wire board 32 wherein the third lead 34 has in it an anti-roll bend but cathode and anode leads 36 and 38 remain straight.

FIGS. 7 and 8 show, respectively, in rear and front end views another capacitor package 40 of this invention sitting on the printed wire board 12, wherein the third and dummy lead 44 has in it an anti-roll bend but cathode and anode leads 46 and 48 remain straight.

FIGS. 9 and 10 show, respectively, in rear and front end views yet another capacitor package 50 of this invention sitting on the printed circuit wiring board 12, wherein the third and dummy lead 54 and the cathode lead 56 are straight as in the prior art but the anode lead 58 has in it an anti-roll bent portion 58a.

FIGS. 11 and 12 show, respectively, in rear and front end views still another capacitor package 60 of this invention sitting on printed wiring board 12, wherein the third and dummy lead 64 and the cathode lead 66 are straight as in the prior art but the anode lead 68 has in it an anti-roll bent portion 68a.

DESCRIPTION OF THE PREFERRED EMBODIMENTS

Referring to FIGS. 4, 5 and 6, the aluminum electrolytic capacitor package 30 has an outer housing, preferably, a cylindrical aluminum can 31. To the closed end of the can 31 there is butt welded a dummy lead 34, as seen in FIG. 5, which is bent to form an ox-bow, in an ox-bow region 34a, to keep the cylindrical capacitor package 30 from rolling on the printed circuit board 32 on the way to a soldering station (not shown).

If the prior art capacitor package 10 as shown in FIG. 3 rolls to the right, the short cathode lead 16 tends to withdraw from hole 22 leading to a failure to solder. But the capacitor package 30 of this invention shown in FIGS. 4, 5 and 6 resists such unwanted rolling owing to the ox-bow construction of the dummy lead 34.

The distal portion 34b of the dummy lead 34 extends through hole 35 in the printed wiring board 32 in a direction at right angles to the plane of the upper printed wire board surface 32a to which the cylindrical aluminum can 31 is tangent. The capacitor-package mounting plane 32a is parallel to the leads plane 33 formed by the axially extending portions 34e, 36e and 38e of the three leads 34, 36 and 38, respectively. This lead forming plane 33 contains the axis 37 of the cylindrical housing 31. The bent down distal portions of the cathode and anode leads 36 and 38 are straight and are perpendicular to the planes 33 and 34; there being no need for further manipulation of the other two leads which would entail additional expense.

Another notable feature of the embodiment of FIGS. 4, 5 and 6 is that the straight distal portion 34b of dummy lead 34 does not lie within a vertical can-axis-containing plane 39 that is at right angles to the leads forming plane 33. Rather, the dummy lead portion 34b and the printed wiring board hole 35 are offset from one (right) side of vertical plane 39 that is the same side of plane 39 from which the short cathode lead 36 is displaced. Such a construction tends to resist rolling in either direction. Thus, the displacement of the distal dummy lead portion 34b may be on either side of plane 39 provided the ox-bow bend 34a extends in the opposite direction. An alternate way to describe this feature is that the distal most portion of the ox-bow bend is a straight portion 34f lying essentially within the capacitor-mounting plane 32a or at least tangent to it and extends through and lies on both sides of the axis-containing plane 39.

Referring to the alternative construction of a capacitor package 40 illustrated in FIGS. 7 and 8, the dummy lead 44 has an ox-bow bend extending away from the vertical can-axis-containing plane 49 on the same side of plane 49 from which the short cathode lead 46 is displaced. The straight distal portion 44b lies within plane 49.

In the embodiment of FIGS. 9 and 10, the dummy lead 54 is straight but the long anode lead 58 has an ox-bow bend 58a in it. This ox-bow bend also extends away from the side of the vertical plane 59 opposite to that from which the short lead 56 is displaced.

The capacitor package of FIGS. 11 and 12 uniquely has a cathode lead 66 and an anode lead 68 that extend the same distance through the printed wire board 12 from the top surface plane 12a. Here the ox-bow bend 68a serves both to prevent rolling and to distinguish the anode lead 68 from the cathode lead 66.

In the above-described embodiments of this invention the longer of the leads was the anode lead following convention. This invention is, however, intended to include aluminum electrolytic capacitor packages wherein the cathode lead is distinguished as being longer than the anode lead.

The embodiments depicted in FIGS. 7 through 12 have a profile in side view the same as those of FIGS. 1 and 4 because it is preferred to extend the ox-bow in a direction at right angles away from the vertical can-axis-containing plane, i.e. 39, 49, 59 and 69.

What is claimed is:

1. An aluminum electrolytic capacitor package comprising:
   (a) an aluminum electrolytic capacitor section having an anode and a cathode lead extending therefrom;
   (b) a cylindrical metal can having a closed end and an open end, said section being positioned within said can with said leads extending axially through said open end and in one axial direction out of said can;
   (c) a third lead being attached to said closed can end and extending away from said can in the other axial direction, said third lead being electrically isolated from said capacitor section,
   said three leads being bent at about right angles away from a leads plane formed by said three leads as they initially extend away from said can, said bent-away portions of said three leads all having straight distal portions that are mutually parallel and that extend through an imaginary capacitor-mounting plane that is tangent to said cylindrical can, said bent-away portion of only one of said leads having an ox-bow bend that extends orthogonally away from a can-axis-containing plane that is at right angles to said leads plane.

2. The capacitor package of claim 1 wherein the distal most portion of said ox-bow bend lies essentially within said capacitor-mounting plane.

3. The capacitor package of claim 2 wherein said distal most portion of said ox-bow bend has a straight portion that is parallel to said capacitor-mounting plane and that extends through and lies on both sides of said axis-containing plane.

4. The capacitor package of claim 1 wherein said third lead is said only one of said leads having said ox-bow bend.

5. The capacitor package of claim 1 wherein the tip ends of said distal lead portions of said anode and cathode leads extend equally away from said capacitor mounting plane.

6. The capacitor package of claim 1 wherein the tip end of said distal lead portion of one of said anode and cathode leads extends further through and away from said capacitor mounting plane than does that of the other.

* * * * *